(12) United States Patent
Wloczysiak

(10) Patent No.: US 9,258,156 B2
(45) Date of Patent: Feb. 9, 2016

(54) BASEBAND ENVELOPE PREDISTORTER

(71) Applicant: SKYWORKS SOLUTIONS, INC., Worburn, CA (US)

(72) Inventor: Stephane Richard Marie Wloczysiak, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/562,228

(22) Filed: Dec. 5, 2014

(65) Prior Publication Data

US 2015/0172081 A1    Jun. 18, 2015

Related U.S. Application Data

(60) Provisional application No. 61/917,464, filed on Dec. 18, 2013.

(51) Int. Cl.
*H04K 1/02* (2006.01)
*H04L 25/49* (2006.01)
*H03F 1/32* (2006.01)
(Continued)

(52) U.S. Cl.
CPC .............. *H04L 25/49* (2013.01); *H03F 1/3247* (2013.01); *H03F 1/3258* (2013.01); *H03F 1/56* (2013.01); *H03F 3/195* (2013.01); *H03F 3/245* (2013.01); *H03F 3/72* (2013.01); *H03M 1/1038* (2013.01); *H03M 1/1047* (2013.01); *H03F 2200/111* (2013.01); *H03F 2200/336* (2013.01); *H03F 2200/387* (2013.01); *H03F 2200/429* (2013.01); *H03F 2200/451* (2013.01); *H03F 2200/541* (2013.01); *H03F 2201/3233* (2013.01); *H03F 2203/7209* (2013.01); *H03F 2203/7221* (2013.01); *H03F 2203/7236* (2013.01); *H03M 1/66* (2013.01)

(58) Field of Classification Search
CPC ................ H03F 1/3247; H03F 1/3258; H03F 2201/3233; H03F 1/3294; H03F 3/24; H03F 2200/336; H03F 1/3241; H03F 2200/451; H03F 3/189; H03F 3/195; H03F 1/3282; H03F 2201/3227; H03F 3/2175; H03F 2200/438; H03F 1/32; H03F 2201/3224; H03F 3/245; H03F 1/3252; H04B 2001/0425; H04B 1/62; H04B 2001/0433; H04B 1/0483; H04B 1/0067; H04B 1/0028; H04L 27/368; H04L 25/03343; H04L 27/2626; H04L 2025/03687; H04L 27/361; H03M 1/1038; H03M 1/104
USPC .................... 375/296, 297; 455/114.3, 115.1; 341/126, 155
See application file for complete search history.

(56) References Cited

U.S. PATENT DOCUMENTS

2008/0207136 A1 * 8/2008 Tang et al. ........................ 455/73
2010/0112962 A1 * 5/2010 van Zeijl et al. ................ 455/77

(Continued)

*Primary Examiner* — Rahel Guarino
(74) *Attorney, Agent, or Firm* — Fernando Hale & Chang LLP

(57) ABSTRACT

Digital predistortion circuity is disclosed including digital interface circuitry configured to receive a digital input signal having a signal bandwidth (BW) centered about a frequency $f_0$ and provide a digital transmission signal based on the digital input signal. The digital predistortion circuitry includes circuitry configured to generate a digital correction signal based at least in part on the digital input signal, one or more first signal transmission paths configured to transmit the digital transmission signal, and one or more second signal transmission paths separate from the one or more first signal transmission paths and configured to transmit the correction signal.

16 Claims, 9 Drawing Sheets

(51) Int. Cl.
*H03M 1/10* (2006.01)
*H03F 1/56* (2006.01)
*H03F 3/195* (2006.01)
*H03F 3/24* (2006.01)
*H03F 3/72* (2006.01)
*H03M 1/66* (2006.01)

(56) References Cited

U.S. PATENT DOCUMENTS

2011/0050339 A1* 3/2011 Ohkawara et al. ............ 330/149
2012/0120990 A1* 5/2012 Koren et al. .................. 375/219

* cited by examiner

BASEBAND ENVELOPE PREDISTORTER

RELATED APPLICATION

This application claims priority to U.S. Provisional Application No. 61/917,464, filed on Dec. 18, 2013, entitled BASEBAND ENVELOPE PREDISTORTER, the disclosure of which is hereby incorporated by reference in its entirety.

BACKGROUND

1. Field

The present disclosure generally relates to electronic signal transmission.

2. Description of Related Art

Within an electronic device, non-linear devices operating in a transmission chain can introduce distortion to electronic signals propagating therethrough, which can negatively impact transmission performance. Various schemes may be implemented to compensate for such non-linearity.

SUMMARY

In some implementations, the present disclosure relates to a digital predistortion circuit including digital interface circuitry configured to receive a digital input signal having a signal bandwidth (BW) centered about a frequency $f_0$ and provide a digital transmission signal based on the digital input signal. The digital predistortion circuit may further include digital predistortion circuitry configured to generate a digital correction signal based at least in part on the digital input signal and one or more first signal transmission paths configured to transmit the digital transmission signal. The digital predistortion circuit may further include one or more second signal transmission paths separate from the one or more first signal transmission paths and configured to transmit the correction signal.

In certain embodiments, the digital predistortion circuit of claim 1 further includes one or more first digital-to-analog converters (DACs) disposed in the one or more first transmission paths and configured to receive the digital transmission signal and convert the digital transmission signal to an analog transmission signal. The digital predistortion circuit may further including one or more second DACs disposed in the one or more second transmission paths and configured to receive the digital correction signal and convert the digital correction signal to an analog correction signal.

The transmission signal may include an in-phase portion and a quadrature portion and the one or more first DACs may include an in-phase DAC and a quadrature DAC. In certain embodiments, the correction signal includes an in-phase portion and a quadrature portion and the one or more second DACs include an in-phase DAC and a quadrature DAC. The digital predistortion circuit may further including one or more variable-gain amplifiers (VGAs) disposed in the one or more second transmission paths downstream from the one or more second DACs. The digital predistortion circuit may further include one or more filters disposed in the one or more first transmission paths downstream from the one or more first DACs.

In certain embodiments, the digital predistortion circuit further includes an analog multiplier module configured to multiply the correction signal and the transmission signal in the analog domain to generate a predistortion signal, the analog multiplier being disposed downstream of the one or more first DACs and the one or more second DACs. The digital analog multiplier module may be further configured to provide the predistortion signal to a power amplifier module. In certain embodiments, the power amplifier module produces a power spectrum having an expanded bandwidth equal to BW times a bandwidth expansion factor (BEF) greater than or equal to 2. The one or more first DACs may operate at a maximum frequency approximately equal to $(f_0+BW/2)$ and the one or more second DACs may operate at a maximum frequency approximately equal to $(BEF \times BW/2)$.

In certain embodiments, the transmission signal is centered at $f_0$. The correction signal may be centered substantially at 0 Hz. In certain embodiments, the correction signal may be generated using the following predistribution algorithm:

$$Z = \sum_{k=0}^{(P-1)/2} c_{2k+1} \times |I+jQ|^{2k} \times (I+jQ).$$

Certain embodiments disclosed herein provide a process of compensating for nonlinearity in a radio-frequency (RF) transmitter. The process may include receiving a digital input signal having a signal bandwidth (BW) centered about a frequency $f_0$, transmitting a digital transmission signal based on the digital input signal over one or more first signal transmission paths, generating a digital correction signal based at least in part on the digital input signal, and transmitting the digital correction signal over one or more second signal transmission paths separate from the one or more first signal transmission paths. In certain embodiments, the process further includes converting the digital transmission signal to an analog transmission signal using one or more first digital-to-analog converters (DACs) disposed in the one or more first transmission paths.

The process may further include converting the digital correction signal to an analog correction signal using one or more second DACs disposed in the one or more second transmission paths. In certain embodiments, the digital transmission signal includes an in-phase portion and a quadrature portion and the one or more first DACs include an in-phase DAC and a quadrature DAC. In certain embodiments, the digital correction signal includes an in-phase portion and a quadrature portion and the one or more second DACs include an in-phase DAC and a quadrature DAC. The process may further include providing the analog correction signal to one or more variable-gain amplifiers (VGAs). The process may further include providing the digital transmission signal to one or more filters.

In certain embodiments, the nonlinearity compensation process includes multiplying the analog correction signal and the analog transmission signal to generate a predistortion signal. The predistortion signal may be provided to a power amplifier module. The power amplifier module may produce a power spectrum having an expanded bandwidth equal to BW times a bandwidth expansion factor (BEF) greater than or equal to 2. In certain embodiments, the one or more first DACs operate at a maximum frequency approximately equal to $(f_0+BW/2)$ and the one or more second DACs operate at a maximum frequency approximately equal to $(BEF \times BW/2)$.

In certain embodiments, the digital transmission signal is centered at $f_0$. The digital correction signal may be centered substantially at 0 Hz. In certain embodiments, generating the digital correction signal is performed using the following predistribution algorithm:

$$Z = \sum_{k=0}^{(P-1)/2} c_{2k+1} \times |I + jQ|^{2k} \times (I + jQ).$$

Certain embodiments disclosed herein provide a wireless device including digital interface circuitry configured to receive a digital input signal having a signal bandwidth (BW) centered about a frequency $f_0$ and provide a digital transmission signal based on the digital input signal. The wireless device may further include digital predistortion circuitry configured to generate a digital correction signal based at least in part on the digital input signal, one or more first signal transmission paths configured to generate and transmit an RF transmission signal based on the digital transmission signal, and one or more second signal transmission paths separate from the one or more first signal transmission paths and configured to generate and transmit an RF correction signal based on the digital correction signal. In certain embodiments, the wireless device further includes signal mixing circuitry configured to generate a corrected RF signal based on the RF transmission signal and the RF correction signal, a power amplifier configured to amplify the corrected RF signal to generate an amplified corrected RF signal, and an antenna configured to transmit the amplified corrected RF signal.

BRIEF DESCRIPTION OF THE DRAWINGS

Various embodiments are depicted in the accompanying drawings for illustrative purposes, and should in no way be interpreted as limiting the scope of the inventions. In addition, various features of different disclosed embodiments can be combined to form additional embodiments, which are part of this disclosure. Throughout the drawings, reference numbers may be reused to indicate correspondence between reference elements.

DETAILED DESCRIPTION

While certain embodiments are described, these embodiments are presented by way of example only, and are not intended to limit the scope of protection. Indeed, the novel methods and systems described herein may be embodied in a variety of other forms. Furthermore, various omissions, substitutions and changes in the form of the methods and systems described herein may be made without departing from the scope of protection. The headings provided herein are for convenience only and do not necessarily affect the scope or meaning of the claimed invention.

In radio frequency (RF) systems, it may be desirable or necessary for transmitter amplifiers to have a certain degree of linearity, such that they substantially accurately reproduce signals present at their input. Nonlinear devices in a transmit chain can create various distortions to the transmitted signal. In particular, for a modulated signal with amplitude variation, nonlinearization may result in reduced signal integrity manifesting itself with Error Vector Magnitude (EVM) as well as spectrum regrowth outside of the transmit bandwidth. In certain embodiments, spectrum regrowth outside the transmit bandwidth can cause undesirable interference with adjacent channels. The present disclosure provides linearization systems and methods that maintain transmit signal integrity through one or more nonlinear devices.

Digital Predistortion

Digital Predistortion (DPD) is a linearization technique using signal pre-emphasis to improve the linearity of RF devices, such as transmitter amplifiers. Certain DPD algorithms apply a correction function within the signal path, which may present unnecessarily wide bandwidth constraints on digital-to-analog converters (DACs) and/or baseband filters. "DPD" may be used herein to refer to a block, module, device or other unit configured to implement one or more digital predistortion functions. Furthermore, "DPD" may refer to processes or concepts associated with digital predistortion. While certain embodiments are described herein in the context of digital predistortion, some of the disclosed features may be implemented as analog predistortion.

Figure 1:
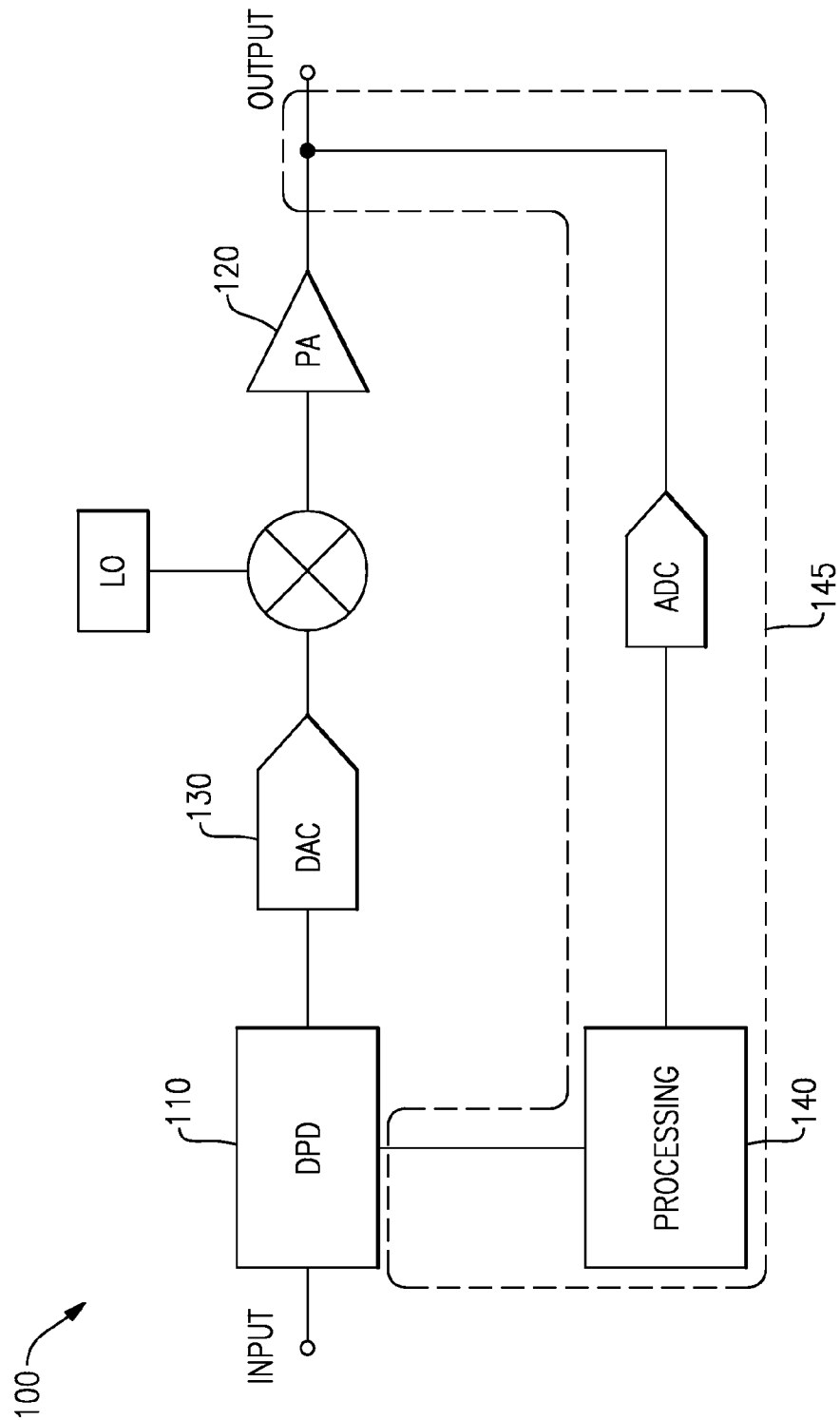
FIG. 1 is a block diagram illustrating a transmission chain for a system including digital predistortion (DPD) according to one or more embodiments.

In certain embodiments, a predistortion circuit inversely models an amplifier's gain and phase characteristics such that, when combined with the amplifier, the circuit produces a system having improved linearity and reduced amplifier distortion. That is, "inverse distortion" may be introduced into the input of the amplifier, thereby effectively cancelling any nonlinearity the amplifier might have. Therefore, DPD can increase the system efficiency by reducing the distortion created by power amplifiers in their nonlinear regions and allowing them to be run efficiently FIG. 1 illustrates a transmission chain for a system including digital predistortion (DPD) according to one or more embodiments. The system may be part of a base transceiver station (BTS) configured to facilitate communication between user devices (e.g., mobile phones, computers, etc.) and a network (e.g., GSM, CDMA, Wi-Fi, WiMAX or other wide area network (WAN) technology, etc.). Alternatively, the system 100 may be a component of a mobile wireless device or other computing device including a wireless transceiver. DPD may be desirable in a BTS system because of the relatively high transmit power of such systems, which may translate into high operational and capital equipment costs when such systems do not employ DPD algorithms to improve efficiency and reduce power consumption.

With reference to FIG. 1, predistortion may comprise the insertion of a nonlinear module 110 before an RF power amplifier 120 in a transmission chain 100. The nonlinear module 110, or digital predistorter (DPD), may have a response that corresponds to the inverse response of the PA 120, such that the overall response at the output of the PA is substantially linear, or more linear than the output would be in the absence of the predistorter 110. In certain embodiments, the predistortion system 100 provides adaptive digital predistortion, which may involve the digital implementation of the predistorter 110 as well as the presence of a feedback loop 145. The feedback loop 145 may be configured to provide a signal relating to the response of the PA 120 that may allow for implementation of changes based on varying operating conditions of the system.

In an adaptive system, the adaptation algorithm(s) may be implemented by a processing module 140. The processing module 140 may implement any suitable or desirable adaptation algorithm(s), such as one or more "blind adaptive" algorithms based on distance-gradient methods, and/or "polynomial function" algorithms that are designed to directly model the relevant nonlinearities. Certain correction factors computed using the adaptation algorithm(s) may be stored in a look-up table (LUT), and may be dynamically updated to reduce errors between the predistorter input and the PA output.

Certain predistortion architectures, as illustrated in FIG. 1, apply signal correction to the signal path, which may be suitable for low bandwidth signals using existing in-phase/quadrature (I/Q) digital-to-analog conversion. However, as the bandwidth increases, achieving suitable linearity can become increasingly challenging, particularly for superheterodyne transmitters, wherein RF and intermediate frequencies are used.

In direct modulation transmitters, the maximum frequency requirement for an associated I/O DAC may be approximately half the signal bandwidth (BW). However, in superheterodyne transmitters, the maximum frequency requirement for an associated I/O DAC may be as high as the sum of the intermediate frequency (IF) and half the signal bandwidth. Therefore, where IF is substantially greater than the signal bandwidth, DAC requirements can become burdensome.

Figure 2:
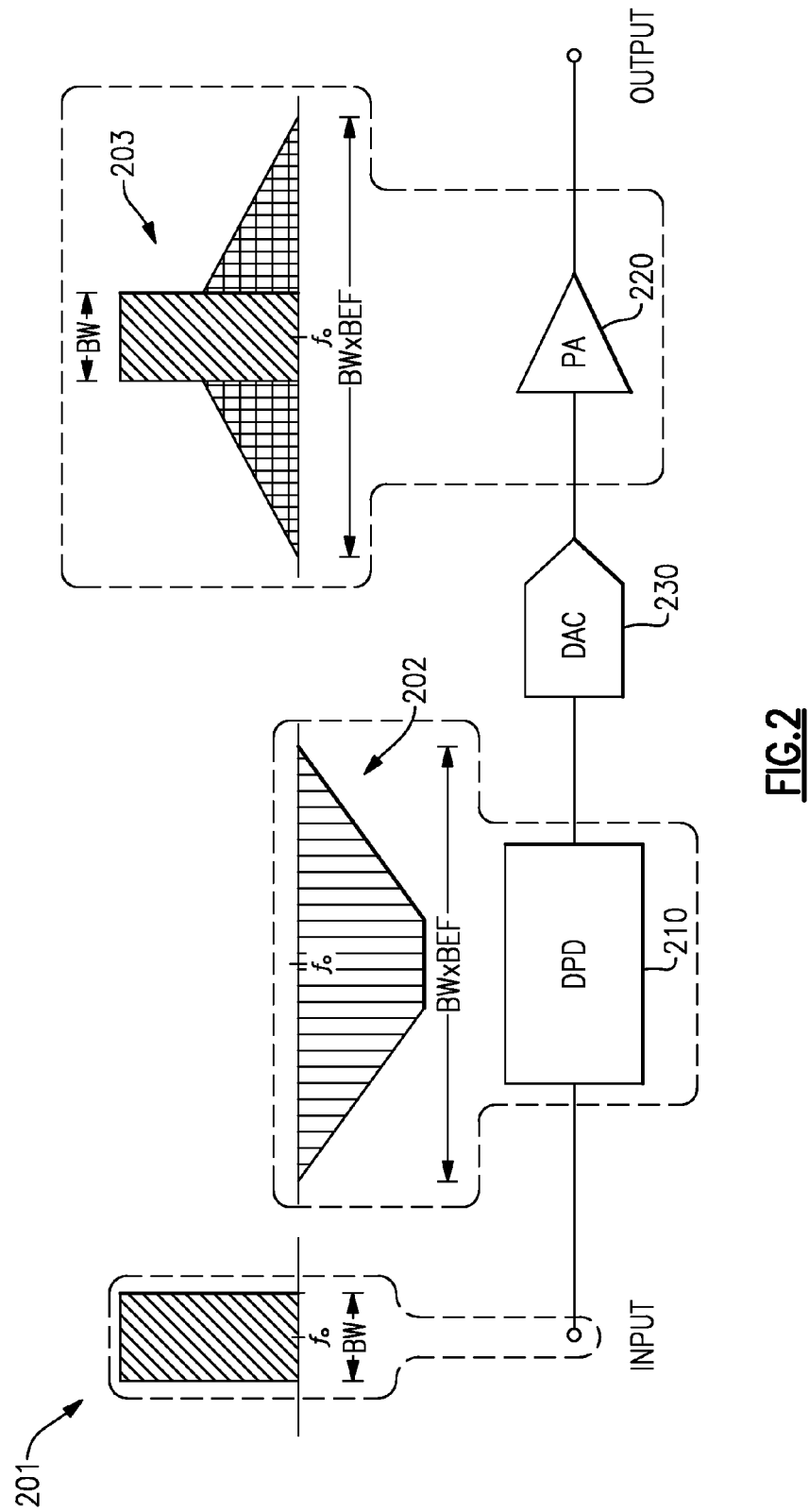
FIG. 2 is a block diagram illustrating a transmission chain for a system including DPD according to one or more embodiments.

FIG. 2 illustrates a transmission chain in, for example, a BTS system. In the system of FIG. 2, an input signal having a bandwidth BW (see 201) is received at an input node. The signal bandwidth may be associated with a channel in a frequency-division multiplexing (FDM) scheme, wherein the channel of interest is centered around a frequency, $f_0$, which may be an intermediate frequency, such as approximately 0 Hz, or between 0-500 MHz. In certain embodiments, the channel bandwidth BW is approximately 20 MHz, 40 MHz, or other range.

The input signal 201 is provided to a DPD module 210 to compensate the input signal for nonlinearity of the downstream power amplifier (PA) 220. In certain embodiments, after digital-to-analog conversion, the signal is up-converted, which may introduce signal noise outside of the channel of interest, causing the overall bandwidth of the signal to be increased by a bandwidth expansion factor (BEF). For example, the BEF may correspond to a multiple of between approximately 3 and 5. The DPD 210 may include a spectrum designed to provide an inversion of the power amplifier response, and therefore may be nonlinear, as illustrated. In order to pass the entire bandwidth of the spectrum 202, the DPD may need to operate at a relatively high speed, which may also result in relatively high power consumption.

Because the system of FIG. 2 is designed to apply signal correction to the signal path prior to the DAC in the transmit chain, it may be necessary for the DPD module to operate at the bandwidth associated with the nonlinear PA 220, such as 3-5 times the input signal bandwidth, as described. Therefore, the DAC, which sits downstream from the DPD module, may likewise need to operate at the increased bandwidth. In an embodiment in which the system of FIG. 2 is a direct conversion system, the I/O DAC min/max frequency range requirement may be from approximately 0 to (BEF×(BW/2)). Alternatively, for an intermediate frequency embodiment, the DAC frequency range requirement may be from approximately $f_0-(BEF\times(BW/2))$ to $f_0+(BEF\times(BW/2))$. As used herein, the terms "center frequency," "intermediate frequency," "IF," and $f_0$" may refer to the center frequency of a signal in a baseband system in which a digital signal is processed at an intermediate frequency lower than RF frequencies. Furthermore, "intermediate frequency," "IF" and "baseband" may refer to systems implementing intermediate frequency digital processing. Certain systems not implementing baseband processing may be referred to as "direct conversion" systems.

As an example demonstrating the bandwidth requirements of the system of FIG. 2, in an embodiment of a direct conversion system including a 40 MHz input signal BW, BEF=5, the DAC bandwidth requirement may grow from approximately 20 MHz to approximately 100 MHz as a result of DPD. That is, the DAC speed of operation may grow from approximately 40 MSPS (million samples per second) to approximately 200 MSPS. With respect to an IF system, with an intermediate frequency $f_0$=150 MHz, DAC bandwidth requirements may increase from approximately 170 MHz to approximately 250 MHz. That is, an increase from approximately 340 MSPS to approximately 500 MSPS.

As another example, in an embodiment of a direct conversion system including a 100 MHz input signal BW, BEF=5, the DAC bandwidth requirement may grow from approximately 50 MHz to approximately 200 MHz as a result of DPD. With respect to an IF system, with an intermediate frequency $f_0$=150 MHz, the frequency range requirements of the DAC, according to the equations listed above, would be from -100 MHz to 400 MHz. Therefore, it may be necessary to increase the intermediate frequency $f_0$ to 250 MHz so that the range is in the positive domain. That is, the speed of the DAC may necessarily be increased from approximately 340 MSPS to approximately 1000 MSPS. Therefore, the intermediate frequency may need to be modified to support predistortion, which may cause undesirable design complications and/or costs.

The DAC requirements illustrated in the above examples demonstrate potential issues associated with DPD in the signal path. Certain embodiments described in greater below provide for correction path routing separate from the signal path, which can result in relatively relaxed I/O DAC requirements, particularly for superheterodyne transmitters.

Separate Correction Path

Figure 3:
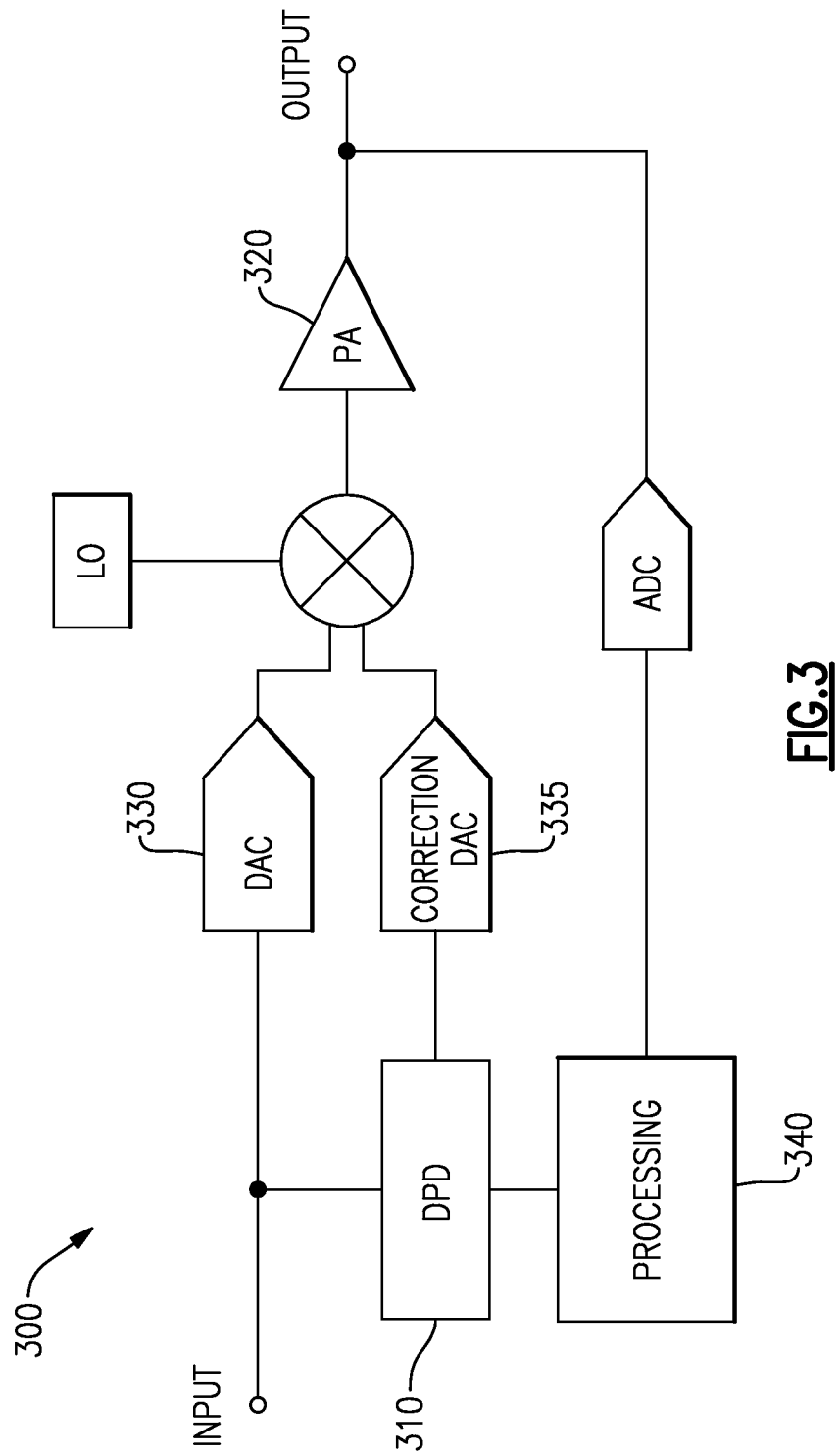
FIG. 3 is a block diagram illustrating a transmission system according to one or more embodiments.

FIG. 3 illustrates a transmission system 300 including a separate correction path including a separate correction DAC 335. The correction DAC 335 may be designed to provide digital-to-analog conversion of the correction signal provided by A DPD module 310. As described above, because the DPD is designed to cancel out nonlinearization caused by the power amplifier (PA) 330, which operates on an up-converted signal, the DPD may be designed to operate at the expanded bandwidth of the up-converted signal. However, as the DPD does not lie in series with the DAC 330, it may not be necessary for the DAC 330 to operate at the expanded bandwidth as well. Therefore, intermediate frequency selection may not require taking into account expanded bandwidth requirements, as described above, thereby potentially reducing system complexity in certain embodiments.

Unlike the DAC 330, the correction DAC 335 may be configured according to expanded bandwidth requirements of the DPD 310 in order to successfully operate on signals generated by the DPD. However, unlike the DAC 330, the correction DAC 335 may be substantially centered on DC (i.e., 0 Hz).

The system 300 includes a feedback loop that provides a measure of the power amplifier response, which may be used to modify the operation of the DPD 310. For example, as PA performance varies over time due to one or more factors, such as temperature, voltage, frequency, etc., it may be desirable to modify the DPD function in an adaptive manner. Application of the DPD function to the signal path may serve to produce a substantially linear response from the power amplifier 320.

The processing module 340 may be configured to generate or select coefficients for a predistortion algorithm used by the DPD module 310. The predistortion algorithm may be any suitable algorithm, such as a least mean squares (LMS) algorithm. For example, the following $5^{th}$-order polynomial algorithm may be used:

$$C_n^P = C_{n-1}^P + \epsilon_n \cdot \mu^P \cdot |Y_n|^P \tag{1}$$

The DPD module 310 may receive the updated coefficients from the processing module 340 and may generate the correction signal based at least in part on the coefficients. In certain embodiments, the DPD module comprises a hardware block, such as an FPGA or other real-time hardware block configured to operate at the appropriate speed in real-time. In certain embodiments, the DPD module comprises an ASIC.

Certain embodiments disclosed herein provide a digital predistortion algorithm that is designed to substantially reduce the bandwidth requirements of various DACs and/or filters in a transmission chain. As shown in FIG. 3, the correction path may be separated from the signal path, wherein the bandwidth requirement of the DAC(s) and/or filter(s) is only a function of the signal bandwidth and decoupled from the predistortion bandwidth. The complex correction signal may be centered on DC and therefore may be able to take advantage of halving the bandwidth requirement using in-phase and quadrature signaling.

Figure 4:
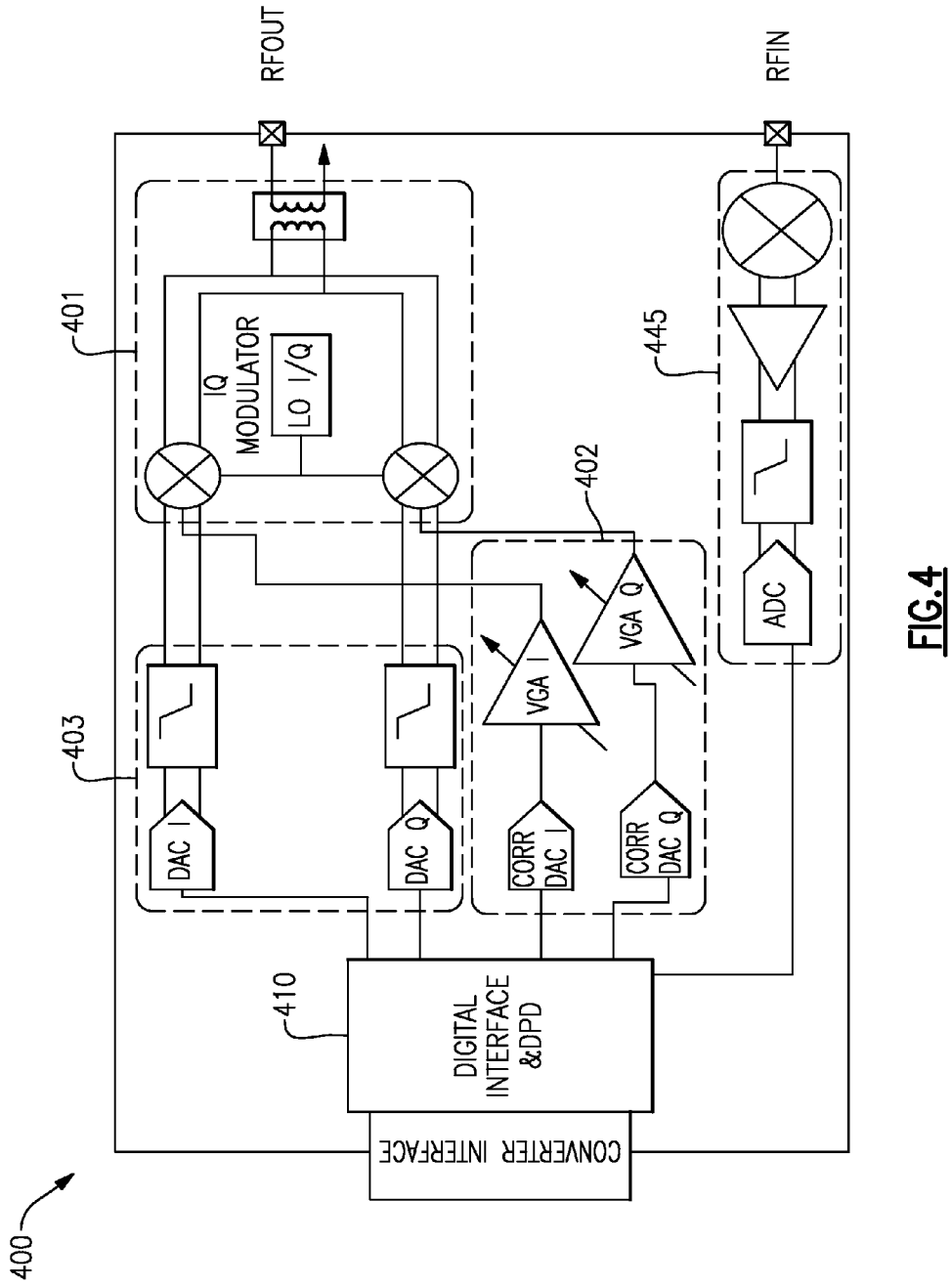
FIG. 4 is a block diagram illustrating a transmission system including separate-path predistortion according to one or more embodiments.

FIG. 4 illustrates an example transmission system 400 including separate-path predistortion. In certain embodiments, the components of the system 400 are disposed on a single die or board. In certain embodiments, one or more of the components are part of one or more field-programmable gate arrays (FPGA), application-specific integrated circuits (ASIC), or other devices or circuits.

The digital interface and DPD module 410 may perform digital processing to compute the correction signal. In certain embodiments, the module 410 includes one or more complex mixers, FIR filters, and/or memory modules. Predistortion may be implemented in any suitable or desirable manner, including, for example, simple LUT mapping of I/Q correction coefficients to signal power, or more complex solutions, such as Volterra series generation. The system 400 includes a converter interface for connecting the digital interface and DPD module to one or more converters.

The DPD module may be configured to operate on the input signal according to the following equation, which provides the DPD output assuming polynomial modeling:

$$Z = \sum_{k=0}^{(P-1)/2} c_{2k+1} \times |I + jQ|^{2k} \times (I + jQ) \tag{2}$$

In equation (2), the gain factor may be represented by the term:

$$c_{2k+1} \times |I + jQ|^{2k} \tag{3}$$

whereas the input portion of equation (2) may be represented by the term:

$$(I + jQ) \tag{4}$$

In certain embodiments, the energy of the gain factor term (3) is centered around DC, and not around IF, for an IF system. This is because the gain term may be a function of the envelope of the signal, wherein its bandwidth expands as the nonlinearity order P increases. Conversely, the input term (3) may be centered around the transmit frequency.

If, for example, the multiplication of the input term (4) and the gain term were performed by the DPD module in the digital domain, as described above, the bandwidth may expand undesirably for intermediate frequency systems. However, if the gain factor is generated and applied from a different path than the input signal, the bandwidth expansion for intermediate frequency systems may be comparable to that of direct conversion systems.

As signal bandwidth widens, the power amplifier (not shown) may begin to exhibit memory effects, which may be caused at least in part by frequency-dependent behaviors of the components in the associated biasing network or the thermal constants of the devices. As a result, the PA may become a nonlinear system with memory. To effectively linearize a PA with memory effects, the predistorter 410 may also comprise memory structures. Certain embodiments provide real-time implementation of memory polynomial predistortion systems. For example, the predistorter 410 may adopt the memory polynomial represented by the following equations.

$$Z = \sum_{n=0}^{M} \sum_{k=0}^{(P-1)/2} c_{2k+1,n} \times |x(t - nT)|^{2k} \times x(t - nT) \tag{5}$$

$$Z = \sum_{n=0}^{M} \sum_{k=0}^{(P-1)/2} c_{2k+1,n} \times |x(t - nT)|^{2k} \times x(t) \tag{6}$$

$$Z = \sum_{n=0}^{M} \sum_{k=0}^{(P-1)/2} c_{2k+1,n} \times \frac{|x(t - nT)|^{2k+1}}{|x(t)|} \times x(t) \tag{7}$$

wherein the input is represented by the term x(t), while the remaining terms comprise the gain factor. In certain embodiments, the gain factor is centered around DC.

In the system of FIG. 4, the I/Q signal DACs may be configured to pass the modulated IF signal. Therefore, the maximum frequency requirement of such modules may be $f_0 + BW/2$. Furthermore, the correction DAC I and correction DAC Q may be configured to pass the gain factor signal. Therefore, the maximum frequency requirement of such modules may be BEF×(BW/2) (e.g., approximately 200 MSPS for 40 MHz). In certain embodiments, the correction signal comprises 12 bits at 100 MSPS.

The region 401 comprises an I/Q modulator with gain control. The system 400 further includes a feedback path, which may include, among possibly other components, one or more mixers, variable-gain amplifiers (VGA), and/or analog-to-digital converters (ADC).

In certain embodiments, the correction DACs and non-correction DACs man be time-aligned in the digital domain. The operation of the I/Q DACs and filters in region 403 may be centered on the intermediate frequency $f_0$, whereas the operation of the correction DACs and amplifiers in region 402 may be centered on DC.

In certain embodiments, the signal DACs and correction DACs are independent and optimized, such that the signal DAC/filter requirements may remain substantially the same as with a system in which there is no predistortion; the signal DACs/filters may be optimized regardless of whether a DPD module is incorporated or not. Therefore, IF frequency selection may be maintained regardless of the presence of a DPD, as the minimum frequency may remain the same as without a DPD. In certain embodiments, the correction DAC(s) may be disabled for power saving when DPD is not required. Therefore, certain embodiments disclosed herein may provide improved flexibility compared to RF predistortion systems.

The power requirements for the signal DAC(s) and correction DAC(s) collectively may be less than the power requirements for a single DAC, or set of I/O DACs, implementing IF-centered correction. Furthermore, unlike certain conventional correction schemes, the correction bandwidth for certain embodiments disclosed herein may be substantially independent from the signal transmit frequency. In certain embodiments, the DAC/filter do not require any wider bandwidth than the signal itself. Furthermore, certain embodiments provide for independence between the correction bandwidth and the signal transmit frequency. For a superheterodyne transmitter, this may translate into a 5× reduction in bandwidth. In certain embodiments, a bandwidth-limited correction path (e.g., limited to 2× or 7.68 MHz) may experience sufficiently no additional degradation compared to a comparable spectrum associated with a non-limited correction path.

Figure 5:
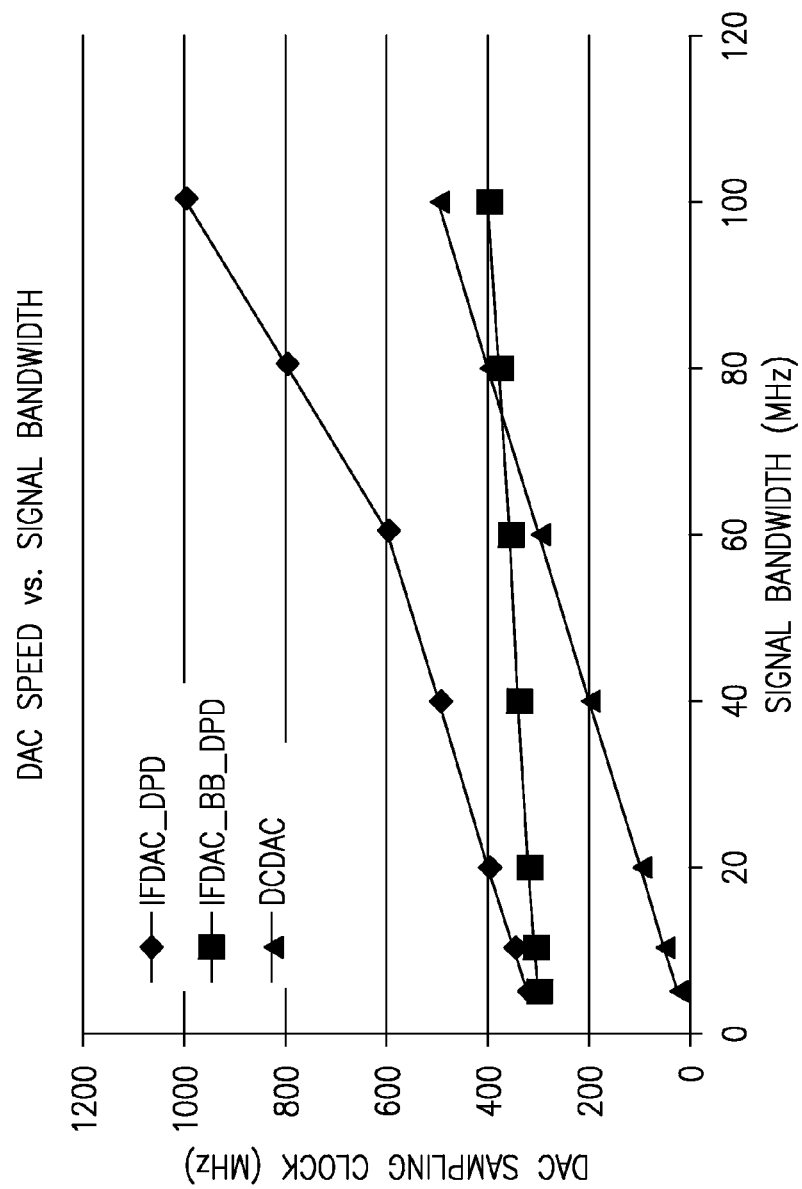
FIG. 5 is a graph illustrating potential DAC speed requirements relative to signal bandwidth according to one or more embodiments.
Figure 6:
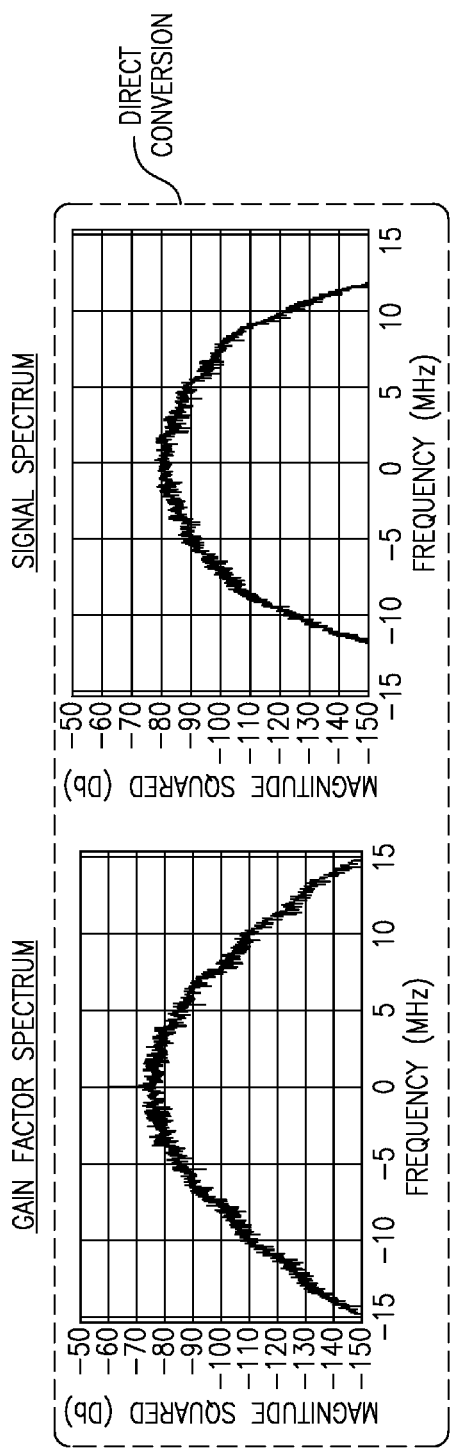
FIGS. 6A-D are graphs illustrating possible power spectra for signal paths and correction paths in a transmitter system according to one or more embodiments.

In certain embodiments, signal and correction DAC speed requirements may remain relatively low compared to very wide bandwidth cases where the signal DAC requirements may be unachievable. FIG. 5 provides a graph illustrating potential DAC speed requirements relative to signal bandwidth according to certain embodiments disclosed herein. The plots of FIG. 5 may correspond to a sampling clock that is approximately two times the maximum signal frequency. The various plots indicate possible minimum DAC speed requirement in order to meet Nyquist criteria. In certain embodiments, in order to meet spurious-free dynamic range (SFDR) requirements, it may be desirable to implement DAC sampling clock speeds up to four to eight times, or more, the maximum signal frequency. Such implementations may make DAC requirements impractically, or undesirably, high, particularly for high-bandwidth cases. As shown in FIG. 5, the DAC sampling clock requirements may be substantially lower for the IF-centered DAC(s) and/or DC-centered correction DAC(s), as illustrated in FIG. 4, than for a single-path intermediate-frequency correction DAC(s), as described above with reference to FIGS. 1 and 2.

FIGS. 6A-D illustrate possible power spectra for signal paths and correction paths in a transmitter system according to some embodiments. As demonstrated in the figures, the gain factor spectrum for both direct conversion transmitters and intermediate frequency transmitters may be centered around DC (i.e., 0 Hz). The signal spectrum, on the other hand, may be centered around the intermediate frequency in intermediate frequency transmitters.

Figure 7:
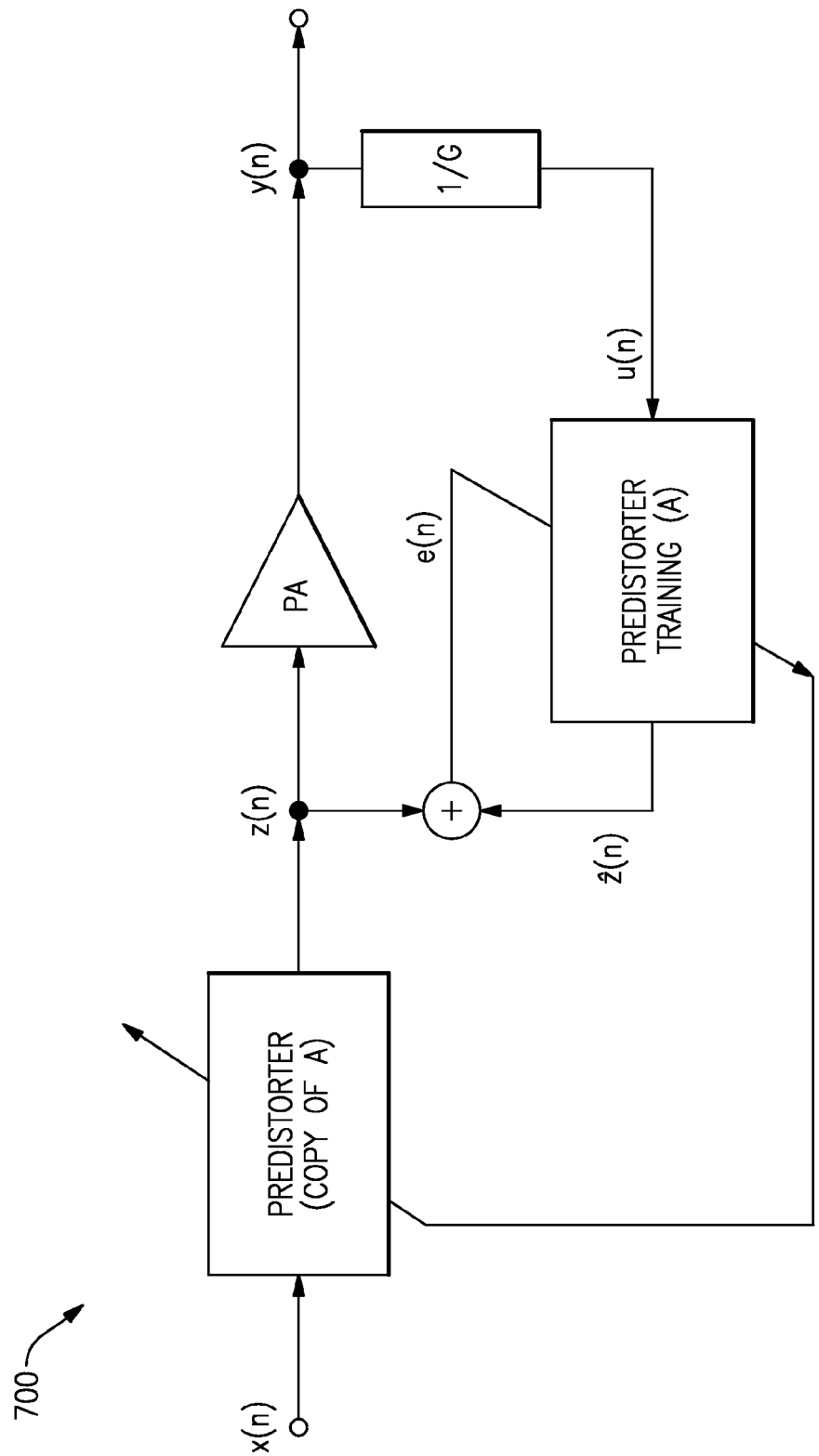
FIG. 7 is a block diagram illustrating an indirect learning architecture according to one or more embodiments.

FIG. 7 illustrates an indirect learning architecture 700 according to one or more embodiments of the present disclosure. For example, the learning architecture 700 may be implemented by one or more of the components of the system 400 of FIG. 4, such as the digital interface and DPD module 410.

Figure 8:
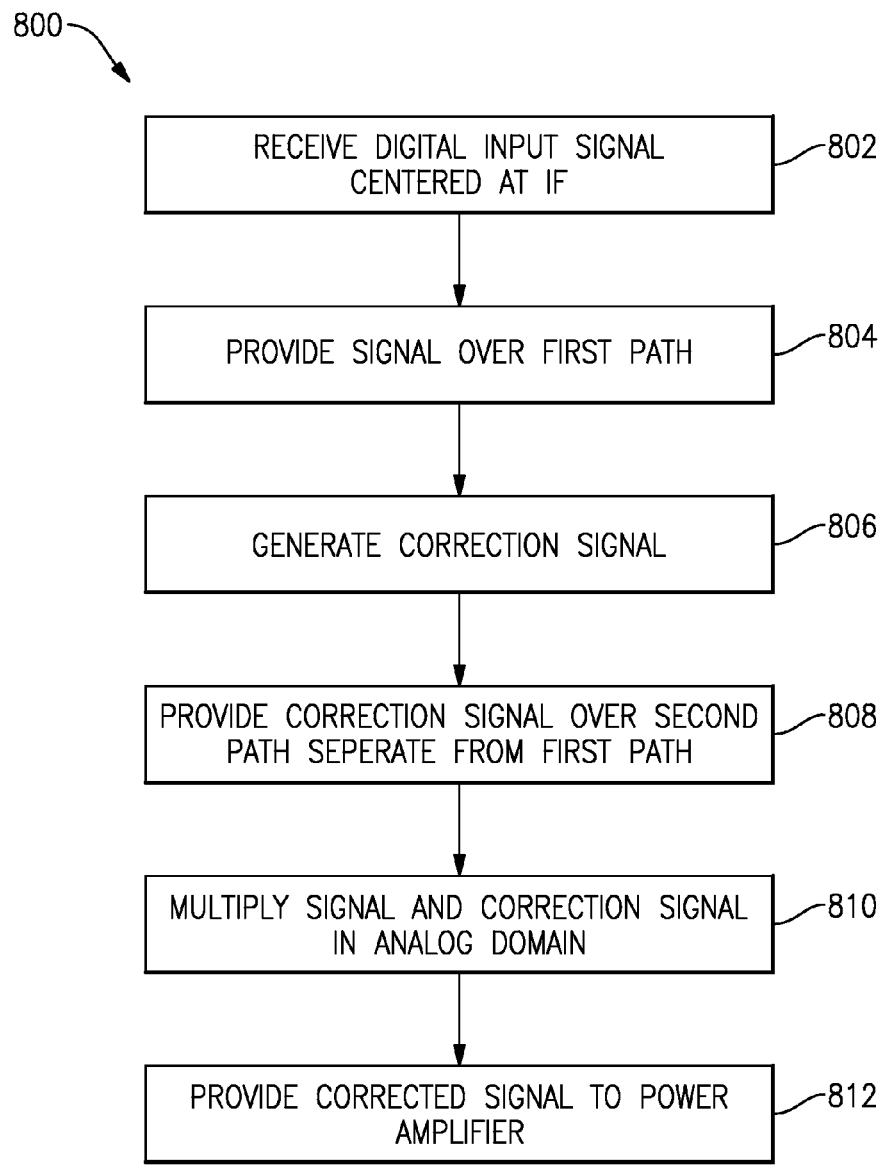
FIG. 8 is a flow diagram illustrating a process of performing digital predistortion in a transmission system according to one or more embodiments.

FIG. 8 illustrates a flow diagram for a process of performing digital predistortion in a transmission system. The process 800 may be performed by one or more of the components of the system 400 described above with respect to FIG. 4.

In some implementations, a device and/or a circuit having one or more features described herein can be included in a wireless communication device 900. Such a device and/or a circuit can be implemented directly in the wireless communication device, in a modular form as described herein, or in some combination thereof. In some embodiments, such a wireless communication device can include, for example, a base transceiver station (BTS), or component thereof, a wireless router, a cellular phone, a smart-phone, a hand-held wireless device with or without phone functionality, a wireless tablet, a laptop computer, etc.

Figure 9:
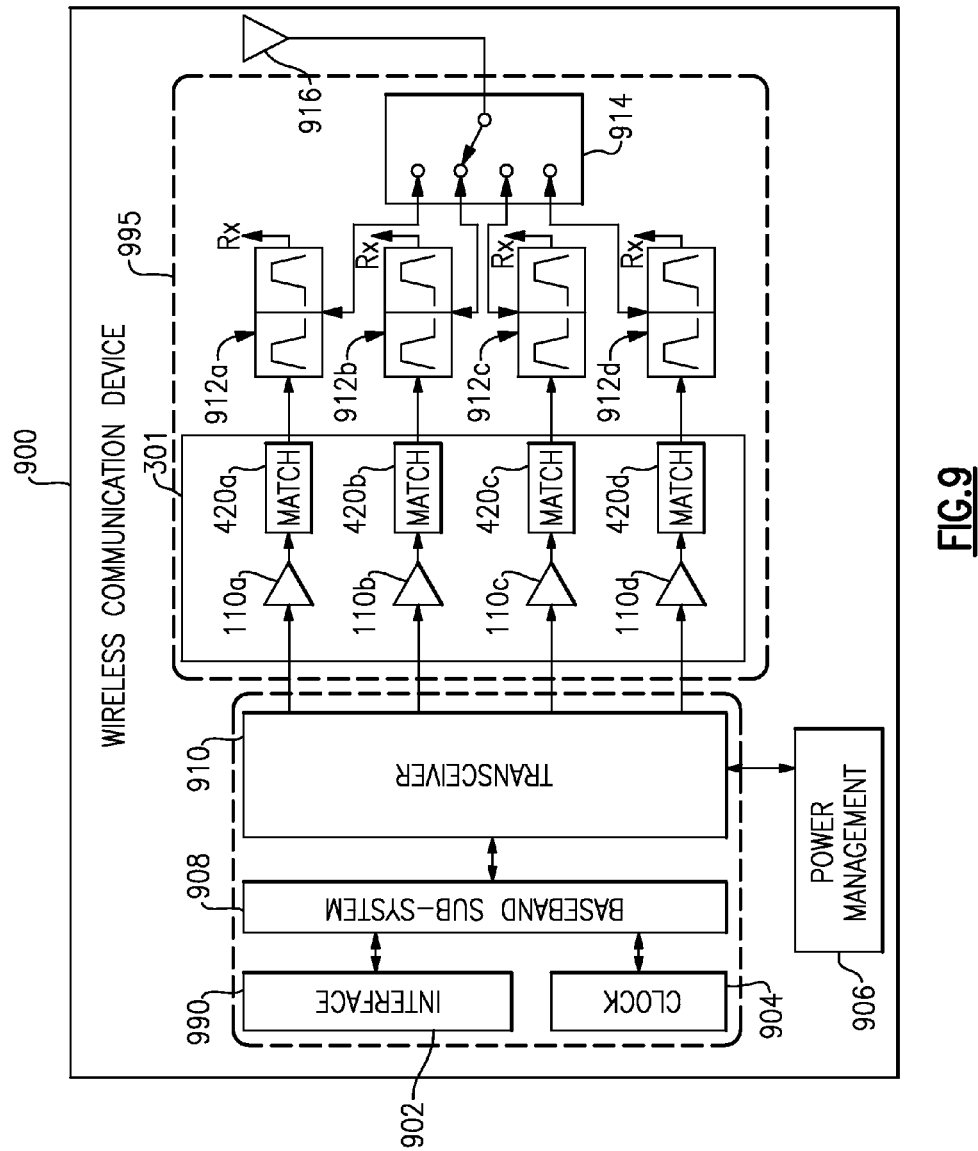
FIG. 9 is a block diagram illustrating a wireless communication device according to one or more embodiments.

FIG. 9 schematically depicts an example wireless communication device 900 having one or more advantageous features described herein. One or more PAs 110 are shown, which can facilitate, for example, multi-band operation of the wireless communication device 900. In embodiments where the PAs and their matching circuits are packaged into a module, such a module can be represented by the box 301.

The PAs 110 can receive their respective RF signals from a transceiver 910 that can be configured and operated in a known manner to generate RF signals to be amplified and transmitted, and/or to process received signals. In certain embodiments, the device 900 does not include receiver functionality. In certain embodiments, such as in a BTS, the device 900 may comprise multiple transceiver units. For example, the device 900 may include six or more transceivers. The transceiver 910 is shown to interact with a baseband sub-system 908 that is configured to provide conversion between data and/or voice signals suitable for a user or host system and RF signals suitable for the transceiver 910. The transceiver 910 is also shown to be connected to a power management component 906 that is configured to manage power for the operation of the device 900. Such power management can also control operations of the baseband sub-system 908 and/or the module 301. In certain embodiments, the power management module 906 comprises, or is connected to, a power supply, which produces power for one or more of the components of the device. For example, the power supply may be configured to rectify AC power and provide DC power to the device.

The baseband sub-system 908 is shown to be connected to an interface 902. The interface 902 may be configured to translate source data having particular electrical standards to digital data for delivery to one or more of the digital components represented by the box 990. Furthermore, the interface 902 may facilitate various input and output of voice and/or data provided to and received from a user. The baseband sub-system 908 can also be connected to a clock 904, which provides a stable clock pulse to one or more of the digital components.

The device 900 includes one or more RF components 995, including one or more power amplifiers, filters, and/or switches. In some embodiments, outputs of the PAs 110 are matched (via match circuits 420) and routed to an antenna 916 via their respective duplexers 912a-912d and a band-selection switch 914. The band-selection switch 914 can include, for example, a single-pole-multiple-throw (e.g., SP4T) switch to allow selection of an operating band. In some embodiments, each duplexer 912 can allow transmit and receive operations to be performed simultaneously using a common antenna (e.g., 916). In FIG. 9, received signals are shown to be routed to "Rx" paths (not shown) that can include, for example, a low-noise amplifier (LNA).

A number of other wireless communication device configurations can utilize one or more features described herein. For example, a wireless communication device may not be a multi-band device. In another example, a wireless communication device can include additional antennas such as diversity antennas, and additional connectivity features. The components described above in connection with FIG. 9 and wireless communication device 900 are provided as examples, and are non-limiting. Moreover, the various illustrated components may be combined into fewer components, or separated into additional components. For example, baseband sub-system 908 can be at least partially combined with the transceiver 910. As another example, the transceiver 910 can be split into separate receiver and transmitter portions.

The wireless communication device 900 may include one or more pseudomorphic high electron mobility transistors (pHEMT), metal semiconductor field effect transistors (MESFET), heterojunction bipolar transistors (HBT), bipolar FETs (BiFET), bipolar HEMTs (BiHEMT), and/or surface acoustic wave (SAW) devices (e.g., SAW filter or resonator) that can include or be connected to gate structures having one or more features as described herein. It will be understood that other semiconductor devices utilized in wireless devices can also benefit from such gate structures. It will also be understood that semiconductor devices associated with other types of electronic devices can also benefit from gate structures having one or more features as described herein.

Many other variations than those described herein will be apparent from this disclosure. For example, depending on the embodiment, certain acts, events, or functions of any of the algorithms described herein can be performed in a different sequence, can be added, merged, or left out all together (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks, modules, and algorithm steps described in connection with the embodiments disclosed herein can be implemented as electronic hardware, computer software, or combinations of both. To clearly illustrate this interchangeability of hardware and software, various illustrative components, blocks, modules, and steps have been described above generally in terms of their functionality. Whether such functionality is implemented as hardware or software depends upon the particular application and design constraints imposed on the overall system. The described functionality can be implemented in varying ways for each particular application, but such implementation decisions should not be interpreted as causing a departure from the scope of the disclosure.

The various illustrative logical blocks and modules described in connection with the embodiments disclosed herein can be implemented or performed by a machine, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor can be a microprocessor, but in the alternative, the processor can be a controller, microcontroller, or state machine, combinations of the same, or the like. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. For example, any of the signal processing algorithms described herein may be implemented in analog circuitry. A computing environment can include any type of computer system, including, but not limited to, a computer system based on a microprocessor, a mainframe computer, a digital signal processor, a portable computing device, a personal organizer, a device controller, and a computational engine within an appliance, to name a few.

The steps of a method, process, or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of non-transitory computer-readable storage medium, media, or physical computer storage known in the art. An exemplary storage medium can be coupled to the processor such that the processor can read information from, and write information to, the storage medium. In the alternative, the storage medium can be integral to the processor. The processor and the storage medium can reside in an ASIC. The ASIC can reside in a user terminal. In the alternative, the processor and the storage medium can reside as discrete components in a user terminal. While the above detailed description has shown, described, and pointed out novel features as applied to various embodiments, it will be understood that various omissions, substitutions, and changes in the form and details of the devices or algorithms illustrated can be made without departing from the spirit of the disclosure. As will be recognized, certain embodiments of the inventions described herein can be embodied within a form that does not provide all of the features and benefits set forth herein, as some features can be used or practiced separately from others.

What is claimed is:

1. A digital predistortion circuit comprising:
digital interface circuitry configured to receive a digital input signal having a signal bandwidth (BW) centered about a frequency $f_0$ and provide a digital transmission signal based on the digital input signal;
digital predistortion circuitry configured to generate a digital correction signal based at least in part on the digital input signal;
one or more first signal transmission paths configured to transmit the digital transmission signal and including one or more first digital-to-analog converters (DACs) configured to convert the digital transmission signal to an analog transmission signal, operation of the one or more first DACs being substantially centered about $f_0$;
one or more second signal transmission paths configured to transmit the digital correction signal, the one or more second signal transmission paths being separate from the one or more first signal transmission paths and including one or more second DACs configured to convert the digital correction signal to an analog correction signal, operation of the one or more second DACs being substantially centered about 0 Hz.

2. The digital predistortion circuit of claim 1 wherein the digital transmission signal includes an in-phase portion and a quadrature portion and the one or more first DACs include an in-phase DAC and a quadrature DAC.

3. The digital predistortion circuit of claim 1 wherein the digital correction signal includes an in-phase portion and a quadrature portion and the one or more second DACs include an in-phase DAC and a quadrature DAC.

4. The digital predistortion circuit of claim 1 further comprising one or more variable-gain amplifiers (VGAs) disposed in the one or more second transmission paths downstream from the one or more second DACs.

5. The digital predistortion circuit of claim 1 further comprising one or more filters disposed in the one or more first transmission paths downstream from the one or more first DACs.

6. The digital predistortion circuit of claim 1 further comprising an analog multiplier module configured to multiply the analog correction signal and the analog transmission signal to generate a predistortion signal, the analog multiplier being disposed downstream of the one or more first DACs and the one or more second DACs.

7. The digital predistortion circuit of claim 6 wherein the analog multiplier module is further configured to provide the predistortion signal to a power amplifier module.

8. The digital predistortion circuit of claim 7 wherein the power amplifier module produces a power spectrum having an expanded bandwidth equal to BW times a bandwidth expansion factor (BEF) greater than or equal to 2.

9. The digital predistortion circuit of claim 8 wherein the one or more first DACs operate at a maximum frequency approximately equal to $(f_0+BW/2)$ and the one or more second DACs operate at a maximum frequency approximately equal to $(BEF \times BW/2)$.

10. The digital predistortion circuit of claim 1 wherein the digital transmission signal is centered at $f_0$.

11. The digital predistortion circuit of claim 1 wherein the digital correction signal is centered substantially at 0 Hz.

12. The digital predistortion circuit of claim 1 wherein the digital correction signal is generated using the following predistribution algorithm:

$$Z = \sum_{k=0}^{(P-1)/2} c_{2k+1} \times |I+jQ|^{2k} \times (I+jQ).$$

13. A method of compensating for nonlinearity in a radio-frequency (RF) transmitter, the method comprising:
  receiving a digital input signal having a signal bandwidth (BW) centered about a frequency $f_0$;
  transmitting a digital transmission signal based on the digital input signal over one or more first signal transmission paths, the one or more first signal transmission paths including a first digital-to-analog converter (DAC) configured to convert the digital transmission signal to an analog transmission signal, operation of the first DAC being substantially centered about $f_0$;
  generating a digital correction signal based at least in part on the digital input signal; and
  transmitting the digital correction signal over one or more second signal transmission paths separate from the one or more first signal transmission paths, the one or more second signal paths including a second DAC configured to convert the digital correction signal to an analog correction signal, operation of the second DAC being substantially centered about 0 Hz.

14. The method of claim 13 wherein the digital transmission signal includes an in-phase portion and a quadrature portion and the one or more first DACs include an in-phase DAC and a quadrature DAC.

15. The method of claim 13 wherein the digital correction signal includes an in-phase portion and a quadrature portion and the one or more second DACs include an in-phase DAC and a quadrature DAC.

16. A wireless device comprising:
  digital interface circuitry configured to receive a digital input signal having a signal bandwidth (BW) centered about a frequency $f_0$ and provide a digital transmission signal based at least in part on the digital input signal;
  digital predistortion circuitry configured to generate a digital correction signal based at least in part on the digital input signal;
  one or more first signal transmission paths including a first digital-to-analog converter (DAC) configured to convert the digital transmission signal to an analog transmission signal, operation of the first DAC being substantially centered about $f_0$;
  one or more second signal transmission paths including a second DAC, the one or more second signal transmission paths being separate from the one or more first signal transmission paths and configured to convert the digital correction signal to an analog correction signal, operation of the second DAC being substantially centered about 0 Hz;
  signal mixing circuitry configured to generate a corrected RF signal based at least in part on the analog transmission signal and the analog correction signal;
  a power amplifier configured to amplify the corrected RF signal to generate an amplified corrected RF signal; and
  an antenna configured to transmit the amplified corrected RF signal.

* * * * *